(12) United States Patent
Humfeld et al.

(10) Patent No.: US 11,262,302 B2
(45) Date of Patent: Mar. 1, 2022

(54) MULTI-WAVELENGTH LASER INSPECTION

(71) Applicant: The Boeing Company, Chicago, IL (US)

(72) Inventors: Keith D. Humfeld, Federal Way, WA (US); Morteza Safai, Newcastle, WA (US)

(73) Assignee: THE BOEING COMPANY, Chicago, IL (US)

( * ) Notice: Subject to any disclaimer, the term of this patent is extended or adjusted under 35 U.S.C. 154(b) by 86 days.

(21) Appl. No.: 16/890,950

(22) Filed: Jun. 2, 2020

(65) Prior Publication Data
US 2020/0300759 A1    Sep. 24, 2020

Related U.S. Application Data

(62) Division of application No. 15/991,292, filed on May 29, 2018, now Pat. No. 10,705,019.

(51) Int. Cl.
*G01N 21/64* (2006.01)
*G01J 3/44* (2006.01)
(Continued)

(52) U.S. Cl.
CPC ........ *G01N 21/6402* (2013.01); *G01J 3/0232* (2013.01); *G01J 3/4406* (2013.01);
(Continued)

(58) Field of Classification Search
CPC ........... G01N 21/6402; G01N 21/6408; G01N 21/645; G01N 2021/6419;
(Continued)

(56) References Cited

U.S. PATENT DOCUMENTS

2005/0001176 A1* 1/2005 Loney ................... G01N 33/58
                                                            250/458.1
2014/0139821 A1   5/2014 Mathieu et al.

FOREIGN PATENT DOCUMENTS

EP        1 998 165       3/2008
WO     2018/005623       1/2018

OTHER PUBLICATIONS

Kebin Shi et al., "Two-Photon Excitation Fluorescence Imaging by Using Wavelength Division Scanning", Technical Digest CD-ROM/ Conference on Lasers and Electro-Optics, Quantum Electronics and Laser Science Conference, Conference on Photonic Applications, Systems and Technologies, Long Beach, CA, May 21, 2006, pp. 1-2.
(Continued)

*Primary Examiner* — Michael C Bryant
(74) *Attorney, Agent, or Firm* — McDonnell Boehnen Hulbert & Berghoff LLP

(57) ABSTRACT

An example system for inspecting a surface includes a laser, an optical system, a gated camera, and a control system. The laser is configured to emit pulses of light, with respective wavelengths of the pulses of light varying over time. The optical system includes at least one optical element, and is configured to direct light emitted by the laser to points along a scan line one point at a time. The gated camera is configured to record a fluorescent response of the surface from light having each wavelength of a plurality of wavelengths at each point along the scan line. The control system is configured to control the gated camera such that an aperture of the gated camera is open during fluorescence of the surface but closed during exposure of the surface to light emitted by the laser.

20 Claims, 7 Drawing Sheets

(51) Int. Cl.
  *G01J 3/02* (2006.01)
  *H01S 5/10* (2021.01)
  *G01J 3/06* (2006.01)
  *G01J 3/28* (2006.01)

(52) U.S. Cl.
  CPC ....... *G01J 3/2889* (2013.01); *G01J 2003/064* (2013.01); *G01N 2021/6419* (2013.01); *G01N 2021/6421* (2013.01); *H01S 5/1092* (2013.01)

(58) Field of Classification Search
  CPC ..... G01N 2021/6421; G01N 2021/641; G01N 2021/646; G01N 2021/8472; G01J 3/0232; G01J 3/4406; G01J 3/2889
  See application file for complete search history.

(56) References Cited

OTHER PUBLICATIONS

Moon S. Kim et al., "Multispectral Fluorescence Lifetime Imaging of Feces-Contaminated Apples by Time-Resolved Laser-Induced Fluorescence Imaging System with Tunable Excitation Wavelengths", Applied Optics, Optical Society of America, Washington, DC, vol. 47, No. 10, Apr. 1, 2008, pp. 1608-1616.
W. Becker, "Fluorescence Lifetime Imaging—Techniques and Applications", Journal of Microscopy, vol. 247, No. 2., Aug. 24, 2012, pp. 119-136.
Extended European Search Report issued by the European Patent Office in application No. EP 19 17 4776.5 dated Oct. 29, 2019.

\* cited by examiner

CONTROLLING AN IMAGE INTENSIFIER OF THE GATED CAMERA SUCH THAT AN APERTURE OF THE GATED CAMERA IS CLOSED DURING EXPOSURE OF THE SURFACE TO THE PULSES OF LIGHT EMITTED BY THE LASER —602

FIG. 6

MULTI-WAVELENGTH LASER INSPECTION

CROSS-REFERENCE TO RELATED APPLICATIONS

The present application is a divisional of U.S. patent application Ser. No. 15/991,292, filed May 29, 2018, the entire contents of which are hereby incorporated by reference.

FIELD

The present disclosure relates generally to fluorescent spectroscopy, and more particularly, to systems and methods for inspecting a surface using fluorescent spectroscopy.

BACKGROUND

Molecules of some compounds can be excited from a ground state to an excited state using a beam of light. During this excitation, individual molecules absorb photons and shortly thereafter emit light having a longer wavelength than the beam of light. This emission of light after absorbing a photon is referred to as fluorescence.

Fluorescent spectroscopy is an inspection technique that involves the analyzing the spectral distribution of light emitted by a sample due to fluorescence. In an example approach, a light source illuminates a sample, causing some of the molecules within the sample to fluoresce. A detector then measures characteristics of the fluorescence, such as the intensity and/or wavelength of the light emitted by the sample.

An emission spectrum of a sample can be generated by exciting a sample at a particular wavelength and measuring the relative intensity of fluorescence over a range of detection wavelengths. Additionally or alternatively, an excitation spectrum of a sample can be generated by measuring the relative intensity of fluorescence at a particular wavelength while the sample is excited over a range of excitation wavelengths.

SUMMARY

In one example, a system for inspecting a surface is described. The system includes a laser, an optical system, a gated camera, and a control system. The laser is configured to emit light at a wavelength that varies over time. The optical system includes at least one optical element, and is configured to direct light emitted by the laser to points along a scan line during a plurality of time intervals such that: the wavelength of the light directed to each point along the scan line varies from point to point within time intervals of the plurality of time intervals, and over the plurality of time intervals, light having each wavelength of a plurality of wavelengths is directed to each point along the scan line. The gated camera is configured to record a fluorescent response of the surface from the light having each wavelength of the plurality of the plurality of wavelengths at each point along the scan line. The control system is configured to control the wavelength of the light emitted by the laser and control gating of the gated camera.

In another example, a system for inspecting a surface is described. The system includes a laser, an optical system, a gated camera, and a control system. The laser is configured to emit pulses of light, with respective wavelengths of the pulses of light varying over time. The optical system includes at least one optical element, and is configured to direct light emitted by the laser to points along a scan line one point at a time. The gated camera is configured to record a fluorescent response of the surface from light having each wavelength of a plurality of wavelengths at each point along the scan line. The control system is configured to control the gated camera such that an aperture of the gated camera is open during fluorescence of the surface but closed during exposure of the surface to light emitted by the laser.

In another example, a method for inspecting a surface is described. The method includes causing a laser to emit pulses of light having respective wavelengths that vary over time. The method also includes directing, using at least one optical element of an optical system, a first pulse of light having a first wavelength to a first point along a scan line and a second pulse of light having a second wavelength to a second point along the scan line. In addition, the method includes recording, using a gated camera, a first fluorescent response of the surface to the first pulse of light and a second fluorescent response of the surface to the second pulse of light. Further, the method includes directing, using the at least one optical element, a third pulse of light having the first wavelength to the second point and a fourth pulse of light having the second wavelength to the first point. Still further, the method includes recording, using the gated camera, a third fluorescent response of the surface to the third pulse of light and a fourth fluorescent response of the surface to the fourth pulse of light.

The features, functions, and advantages that have been discussed can be achieved independently in various examples or may be combined in yet other examples further details of which can be seen with reference to the following description and figures.

BRIEF DESCRIPTION OF THE FIGURES

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying figures, wherein:

FIG. 6 shows an additional operation for use with the method shown in FIG. 6, according to an example.

DETAILED DESCRIPTION

Figure 1:
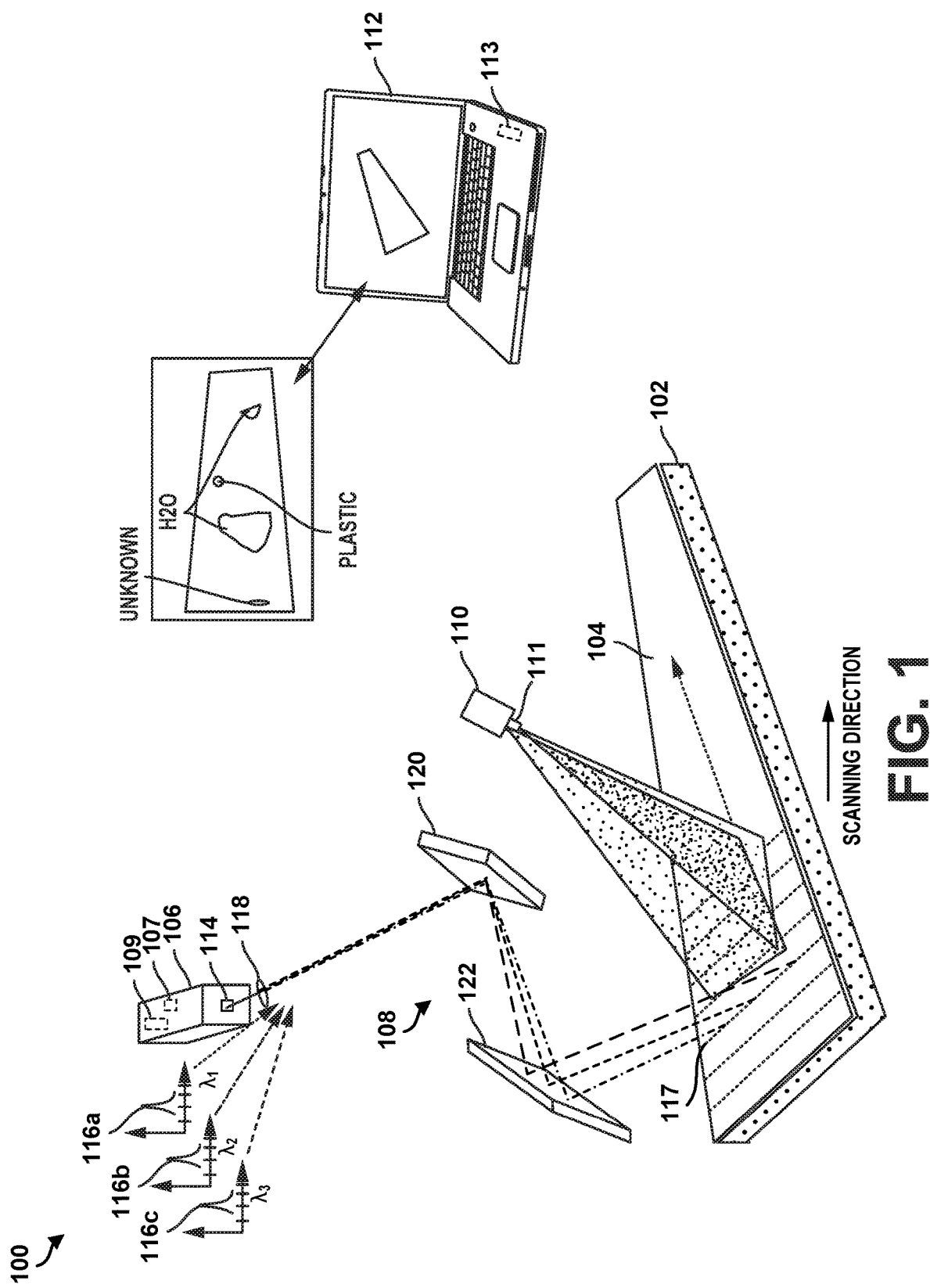
FIG. 1 illustrates an example system, according to an example.

Disclosed examples will now be described more fully hereinafter with reference to the accompanying figures, in which some, but not all of the disclosed examples are shown. Indeed, several different examples may be provided and should not be construed as limited to the examples set forth herein. Rather, these examples are provided so that this disclosure will be thorough and complete and will fully convey the scope of the disclosure to those skilled in the art.

Described herein are systems and methods for inspecting a surface. The systems and methods can be used to rapidly scan a surface, such as the surface of a composite part, to identify any materials on its surface via fluorescent spectroscopy. For instance, the systems and methods can be used to determine the cleanliness of a surface, which may be beneficial during preparation of a surface for sealing, painting, priming, and bonding operations.

An example system may include a laser configured to emit light at a wavelength that varies over time, an optical system, a gated camera, and a control system. The laser can include a transducer configured to excite a pressure wave down a length of a lasing medium of the laser such that the pressure wave modifies energy levels of the lasing medium over time, thereby altering the wavelength of the light emitted by the laser. The optical system can include at least one optical element that guides light emitted by the laser towards a surface of a part. For instance, the optical system can be configured to direct light emitted by the laser to points along a scan line during a plurality of time intervals such that: (i) the wavelength of the light directed to each point along the scan line varies from point to point within time intervals of the plurality of time intervals, and (ii) over the plurality of time intervals, light having each wavelength of a plurality of wavelengths is directed to each point along the scan line.

The gated camera can be configured to record a fluorescent response of the surface from the light emitted by the laser. For instance, the gated camera can be configured to record a fluorescent response of the surface from light having each wavelength of the plurality of wavelengths at each point along the scan line. To accomplish this, the control system can be configured to synchronize operation of the laser with operation of the gated camera. For instance, the control system can be configured to control a shutter of the laser and an electronic gating system of the gated camera such that an aperture of the gated camera is open to light during fluorescence of the surface but closed during exposure of the surface to light emitted by the laser.

Advantageously, fluorescent responses obtained using the systems and methods disclosed herein can yield a higher signal-to-noise ratio (SNR) than fluorescent responses that can be obtained using ordinary fluorescent spectroscopy. With ordinary fluorescent spectroscopy, an entire surface is illuminated at once. On the other hand, the described systems and methods can operate by shining a pulse of light having a relatively small spot size at points along a scan line one point at a time. With the described systems and methods, the intensity of the applied light, and therefore the intensity of the fluoresced light, can be much higher than intensity that can be obtained when illuminating the entire surface at once.

Further, the level of noise in the fluorescent response can be less than the level of noise in fluorescent responses obtained using ordinary fluorescent spectroscopy. By shining light having individual wavelengths of a range of wavelengths one at a time rather than shining light having a broad spectrum, the described systems and methods can avoid shining any light at the fluorescent wavelengths when the surface material is fluorescing. In addition, the synchronization of the laser with the gated camera can also decrease the level of noise. While the gated camera's aperture is open to light, the laser light can be blocked by a shutter of the laser.

The described systems and methods can also apply a high power beam of light to a spot on a surface without damaging the surface. If light is continuously applied to a small spot on a surface, the surface can become overheated, and potentially be damaged. The described systems and methods can help to avoid this problem in various ways. For example, the laser can be shuttered so that the laser emits pulses of light and the long term time-averaged intensity on the surface is moderate even while the instantaneous intensity of each pulse is high. Additionally or alternatively, the light emitted by the laser can pass through a prism which changes the point that the laser light strikes the surface of a part as the wavelength of the light emitted by the laser changes.

The described systems and methods can also yield more chemical information about materials on a surface than ordinary fluorescent spectroscopy. Ordinarily, white (i.e., broad spectrum) light is shown on a surface. The fluorescent response to the light therefore provides information about the surface's response to a broad spectrum of wavelengths. Whereas, with the described systems and methods, light having a particular wavelength of a range of wavelengths can be shown on a surface, with that wavelength changing over time. The resulting fluorescent response therefore provides information about how the surface, including any materials on the surface, responds to each wavelength individually. As a result, the described systems and methods can be used to build a superior chemical signature, as compared to traditional fluorescent spectroscopy.

Various other features of these systems and methods are described hereinafter with reference to the accompanying figures.

Referring now to FIG. 1, FIG. 1 illustrates an example system 100, according to an example embodiment. In line with the discussion above, system 100 can be used to inspect a part 102. For example, system 100 can be used to inspect part 102 to identify any materials on a surface 104 of part 102. As shown in FIG. 1, system 100 includes a laser 106, an optical system 108, a gated camera 110, and a control system 112.

Laser 106 can be configured to emit light at a wavelength that varies over time. Laser 106 can include an excitation source, or pump, configured to beam energy into a lasing medium. In one example, the lasing medium can absorb the energy, exciting electrons in the lasing medium from a first energy state (ground state) to a third energy state (pump level). The electrons can then relax to a second energy state, undergoing what is sometimes referred to as a radiation-less transition. In addition, an electron in the second energy state may decay by spontaneous emission to the first energy state, releasing a photon. The energy of the photon, and therefore the wavelength of the photon, corresponds to a difference between the second energy state and the first energy state. Laser 106 can also include a dielectric mirror 107 that reflects light back into the lasing medium in order to stimulate more emission of photons and increase an intensity of the light emitted by laser 106.

Laser 106 can also include a transducer 109 configured to excite a pressure wave down a length of the lasing medium, parallel to the direction of stimulated emission of light. A pressure wave in a solid medium pushes atoms within that medium together, shortening their separation. The pressure wave within the lasing medium can therefore push atoms together within the lasing medium, shortening their separation. The change in separation can alter the energy levels of the first, second, and third energy states. The change in separation occurs on a time scale that is slower with respect to the absorption and emission of light. Therefore, as the pressure wave alters the energy levels of the first, second, and third energy states, the pressure wave alters the difference between the first and second energy states, and alters the wavelength of light emitted by laser 106. As the pressure wave continues to move across the lasing medium, the pressure wave can continue to alter the energy levels of the first and second energy states, and alter the wavelength of light emitted by laser 106. Thus, transducer 109 operating on the lasing medium can enable laser 106 to emit a continuously varying, controlled, predictable range of wavelengths of light.

Likewise, dielectric mirror 107 can experience the same pressure wave and be compressed and stretched with the lasing medium. Expanding the dielectric mirror's physical dimension can change an index of refraction and depth of the dielectric mirror, thereby changing the frequency of light that gets primarily reflected in order to increase an intensity of laser 106. The material of the dielectric mirror can be chosen such that the response of the dielectric mirror to the pressure wave approximately matches the response of the lasing medium to the pressure wave.

As a particular example, laser 106 can be a ruby laser configured to emit a 694.3 nanometer laser beam. The lasing medium of the ruby laser (a ruby crystal) can have a 345 gigapascals (GPa) Young's modulus, a 2.1 GPa tensile strength, a 4.75 angstrom lattice constant in a first direction, and a 12.98 angstrom lattice constant in a second direction. With this configuration, the lasing medium of the ruby laser can be stretched by 2.1/345 (approximately 0.6%) before it may "break". Breaking refers to a point where the interaction between neighboring atoms becomes so weak that relative motion of the atoms is no longer constrained. And, in any material, the strength of the interaction between atoms is defined by the energy levels of the shared electrons.

The ruby crystal may have a second energy state and a first energy state separated by 1.79 electron volts (eV) corresponding to a wavelength of 694.3 nanometers in an unstretched state. As the ruby crystal stretches and the interatomic separation increases, the energy gap between the second energy state and the first energy state can decrease with the increased separation, such that the wavelength increases. Hence, a pressure wave could cause the ruby crystal to stretch, and produce light having a wavelength greater than 694.3 nm. Similarly, the ruby crystal could be compressed by the pressure wave, causing the wavelength of light emitted by the laser to decrease below 694.3 nm.

In other examples, laser 106 could be a semiconductor laser. For example, laser 106 could be an indium gallium nitride (InGaN) laser that lases at around 405 nm, a gallium indium phosphide (GaInP) or aluminum gallium indium phosphide (AlGaInP) laser that lases at around 650 nm, or a gallium aluminum arsenide (GaAlAs) laser that lases at around 785 nm. Hence, the example of the ruby laser is not meant to be limiting.

In some examples, laser 106 can include a shutter 114. Shutter 114 can be controlled electronically by control system 112 and synchronized with the transducer, so that the shutter intermittingly blocks light emitted by the laser. In other words, shutter 114 can be controlled so that laser 106 emits time-separated pulses of light, with the wavelengths of the pulses of light varying over time. By way of example, FIG. 1 depicts a first pulse 116a having a first wavelength, a second pulse 116b having a second wavelength, and a third pulse 116c having a third wavelength.

Laser 106 can also include a filter 116. Filter 116 can be configured to filter the wavelength of light that passes through to optical system 108. For instance, filter 116 can filter out light having wavelength above an upper frequency and/or cut off light having a wavelength below a lower frequency. In one example, filter could be a wedge-tapered multi-layer interference filter.

Optical system 108 can be configured to spread out in space different wavelengths of light emitted by laser 106. For instance, optical system can be configured to direct light emitted by laser 106 to points along a scan line 117. In one example, optical system 108 can be configured to direct light emitted by laser 106 to points along scan line 117 during a plurality of time intervals such that: (i) the wavelength of the light directed to each point along scan line 117 varies from point to point within time intervals of the plurality of time intervals, and (ii) over the plurality of time intervals, light having each wavelength of a plurality of wavelengths is directed to each point along scan line 117.

Optical system 108 could cause points along scan line 117 to be illuminated one point at a time with light having a single wavelength of the plurality of wavelengths. For instance, optical system 108 can include a first scanning mirror 120 and a second scanning mirror 122 that are controllable by control system 112. During a first time interval, first scanning mirror 120 can spread out first, second, and third pulses 116a-c to respective points along scan line 117. In order to achieve this, first scanning mirror 120 can be at a first position when first pulse 116a contacts first scanning mirror 120, such that first pulse 116a reflects off of second scanning mirror 122 and contacts a first point along scan line 117. First scanning mirror 120 can then rotate to a second position when second pulse 116b contacts first scanning mirror 120, so that second pulse 116b reflects off of second scanning mirror 122 and contacts a second point along scan line 117. Further, first scanning mirror 120 can then rotate to a third position when third pulse 116c contacts first scanning mirror 120, so that third pulse 116c reflects off of second scanning mirror 122 and contacts a third point along scan line 117.

During a second time interval, first scanning mirror 120 can be controlled to translate the illumination points for the first, second, and third pulses 116a-c along scan line 117. For instance, first scanning mirror 120 can be controlled so that first pulse 116a contacts the second point, second pulse 116b contacts the third point, and third pulse 116c contacts the first point. Similarly, during a third time interval, first scanning mirror 120 can be controlled to translate the illumination points again. In other words, first scanning mirror 120 can be controlled so that each of three points along scan line 117 is individually illuminated by each of the first, second, and third pulses 116a-c. In practice, the number of points along a scan line could be greater than three. For instance, the number of points could be 10, 50, 100, or more.

Second scanning mirror 122 can be configured to translate the scan line. For instance, after each of three points along the scan line is individually illuminated by each of the first, second, and third pulses 116a-c, second scanning mirror 122 can rotate to a different position so that the scan line advances along surface 104. In this manner, second scanning mirror 122 can translate the scan line from a first segment on surface 104 to a second segment on surface 104.

Gated camera 110 can be configured to record a fluorescent response of surface 104 from light emitted by laser 106. For instance, gated camera 110 can be configured to record a fluorescent response of surface 104 from light having each wavelength of the plurality of wavelengths at each point along the scan line. As used herein, the fluorescent response of surface 104 may refer to a fluorescent response of surface 104 itself or a fluorescent response of a material, such as a surface contaminant, that is present on surface 104.

In one example, gated camera 110 can include an image intensifier 111 configured to increase an intensity of available light that is received at gated camera 110. For instance, image intensifier 111 can be an optoelectronic device that converts photons emitted by materials on surface 104 into electrons, amplifies those electrons, and then converts the electrons back into photons of light.

Gated camera 110 can be electronically-gated. For instance, gated camera 110 can include an electronic gating system that functions like a camera shutter, allowing light to be received through an aperture of gated camera 110 when the electronic gate is enabled but preventing light from passing through the aperture of gated camera 110 when the electronic gate is disabled. The gating duration could be very short, such as a few nanoseconds or even a few picoseconds. The electronic gating system can include high-speed digital delay generators, which allow a control system to specify when the electronic gate is enabled and/or disabled relative to the start of an event. The gating of the electronic gating system could be controlled by control system 112. In one example, the electronic gating system could be part of image intensifier 111. For instance, image intensifier 111 could be an electronically-gated image intensifier. The electronically-gated image intensifier can include one or more lenses, a photocathode, a microchannel plate, a phosphor screen, and electronics for providing different voltage biases to the photocathode, microchannel plate, and phosphor screen.

In an example configuration, laser 106, optical system 108, and gated camera 110 can be mounted to an apparatus, such as a housing, frame, or other support structure. Part 102 could then be brought near (e.g., under) the apparatus for inspection. Additionally or alternatively, the apparatus can be portable, and can be moved to a location of part 102 for in order to inspect part 102.

Control system 112 can include a processor 113 and a non-transitory computer-readable medium storing program instructions that are executable by processor 113 to carry out any of the control system functions described herein. Processor 113 could be any type of processor, such as a microprocessor, digital signal processor, multicore processor, etc. Alternatively, the control system 112 could include a group of processors that are configured to execute the program instructions, or multiple groups of processors that are configured to execute respective program instructions.

Control system 112 can include a computing device such as a laptop computer, mobile computer, wearable computer, tablet computer, desktop computer, or other type of computing device. As such, control system 112 can include a display, an input device, and one or more communication ports through which the control system is configured to communicate with other devices of system 100 as well as devices that are not part of system 100.

Control system 112 can be connected to laser 106, optical system 108, and gated camera 110 by way of one or more wired or wireless communication links. In this manner, control system 112 can send data to and/or receive data from laser 106, optical system 108, and gated camera 110.

In line with the discussion above, control system 112 can be configured to control the wavelength of light emitted by laser 106 and control gating of gated camera 110. In this regard, control system 112 can be configured to control a transducer that provides a pressure wave within a lasing medium of laser 106. Control system 112 can also be configured to control shutter 114 of laser 106 such that shutter 114 intermittingly blocks light emitted by the laser, yielding pulses of light. In addition, control system 112 can be configured to control shutter 114 such that shutter 114 blocks light emitted by laser 106 when an aperture of gated camera 110 is open to light.

Further, control system 112 can be configured to control an electronic gating system of gated camera 110. When light impinges on surface 104, light is absorbed by surface 104. A predictable time after the arrival of that light, the surface 104 may fluoresce, releasing light at a variety of frequencies. Control system 112 can control the electronic gating system of gated camera 110 such that the aperture of gated camera 110 is open during fluorescence but closed during exposure of surface 104 to the light from laser 106. This synchronization can allow gated camera 110 to detect only fluorescing light and not reflected light from laser 106.

In addition, a processor of control system 112, or a processor of another computing device, can be configured to identify a material on surface 104 by analyzing fluorescent responses of surface 104 recorded by gated camera 110. For example, the fluorescent responses collected at a given point on surface 104, across a variety of excitation wavelengths, can be used to determine the chemical composition of surface 104. The chemical composition of surface 104 may be indicative of whether a material, such as a cutting liquid, water, plastic, or other agent is present on surface 104 at the given point.

Figure 2:
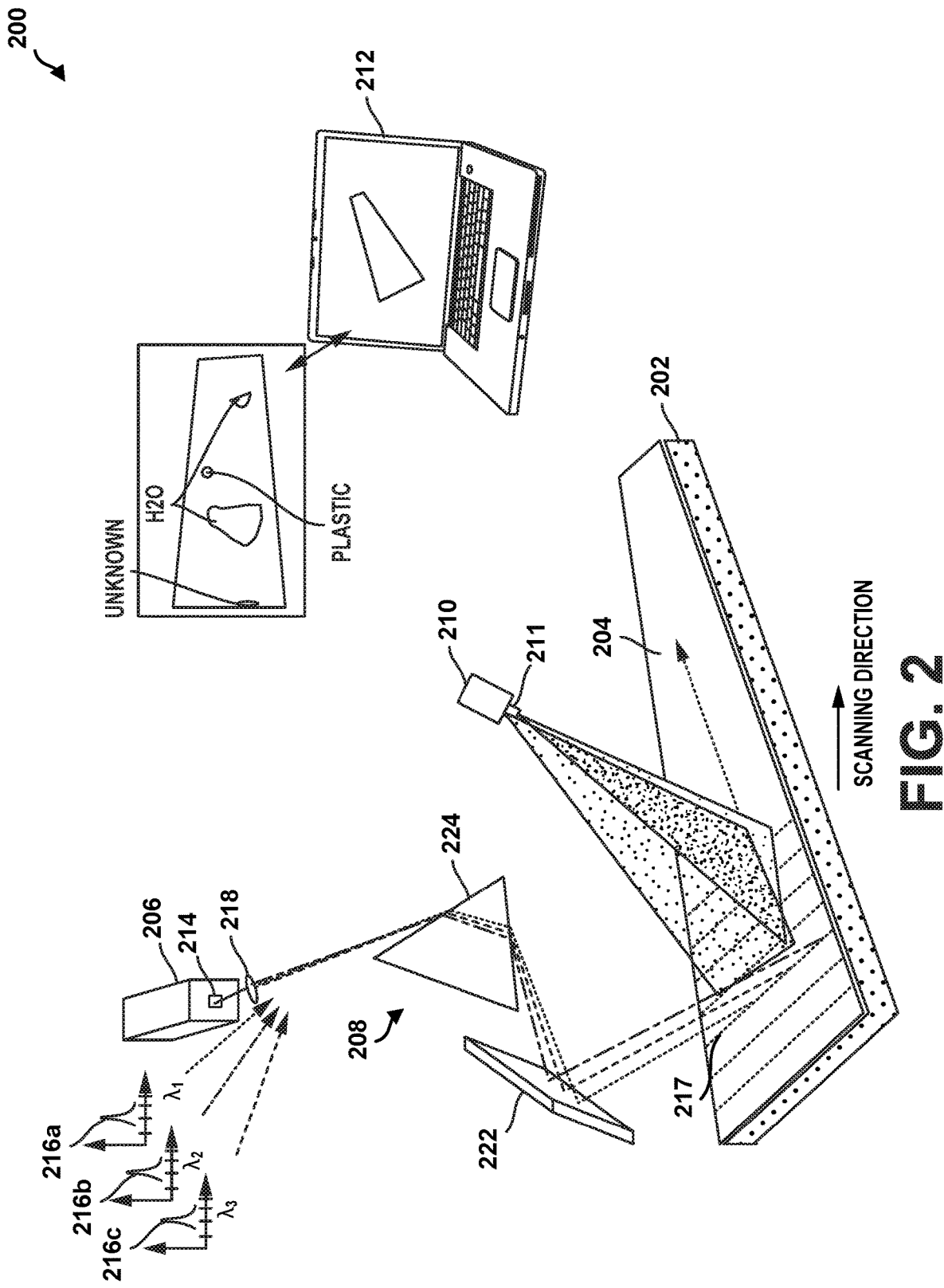
FIG. 2 illustrates another example system, according to an example.

FIG. 2 illustrates another example system 200, according to an example embodiment. Like system 100 of FIG. 1, system 200 can be used to inspect a part 202. For example, system 200 can be used to inspect part 202 to identify any materials on a surface 204 of part 202. Like system 100 of FIG. 1, system 200 includes a laser 206, an optical system 208, a gated camera 210, and a control system 212. However, unlike optical system 108 of FIG. 1, which includes first scanning mirror 120 and second scanning mirror 122, optical system 208 instead includes a prism 224 and a scanning mirror 222.

Prism 224 can be configured to cause the wavelength of the light directed to each point along scan line 217 to vary from point to point within time intervals of a plurality of time intervals. For instance, prism 224 can be configured to cause first, second, and third pulses 216a-c to illuminate first, second, and third illumination points, respectively, along scan line 217 during a first time interval. Scanning mirror 222 can then be configured to translate the illumination points for the first, second, and third pulses 216a-c along scan line 217 for a subsequent time interval. Like second scanning mirror 122 of FIG. 1, scanning mirror 222 can also be configured to translate scan line 217 from a first segment on surface 204 to a second segment on surface 204. For instance, scanning mirror 222 can be configured to translate scan line 217 after light having each wavelength of a plurality of wavelengths is directed to each point along scan line 217.

Figure 3:
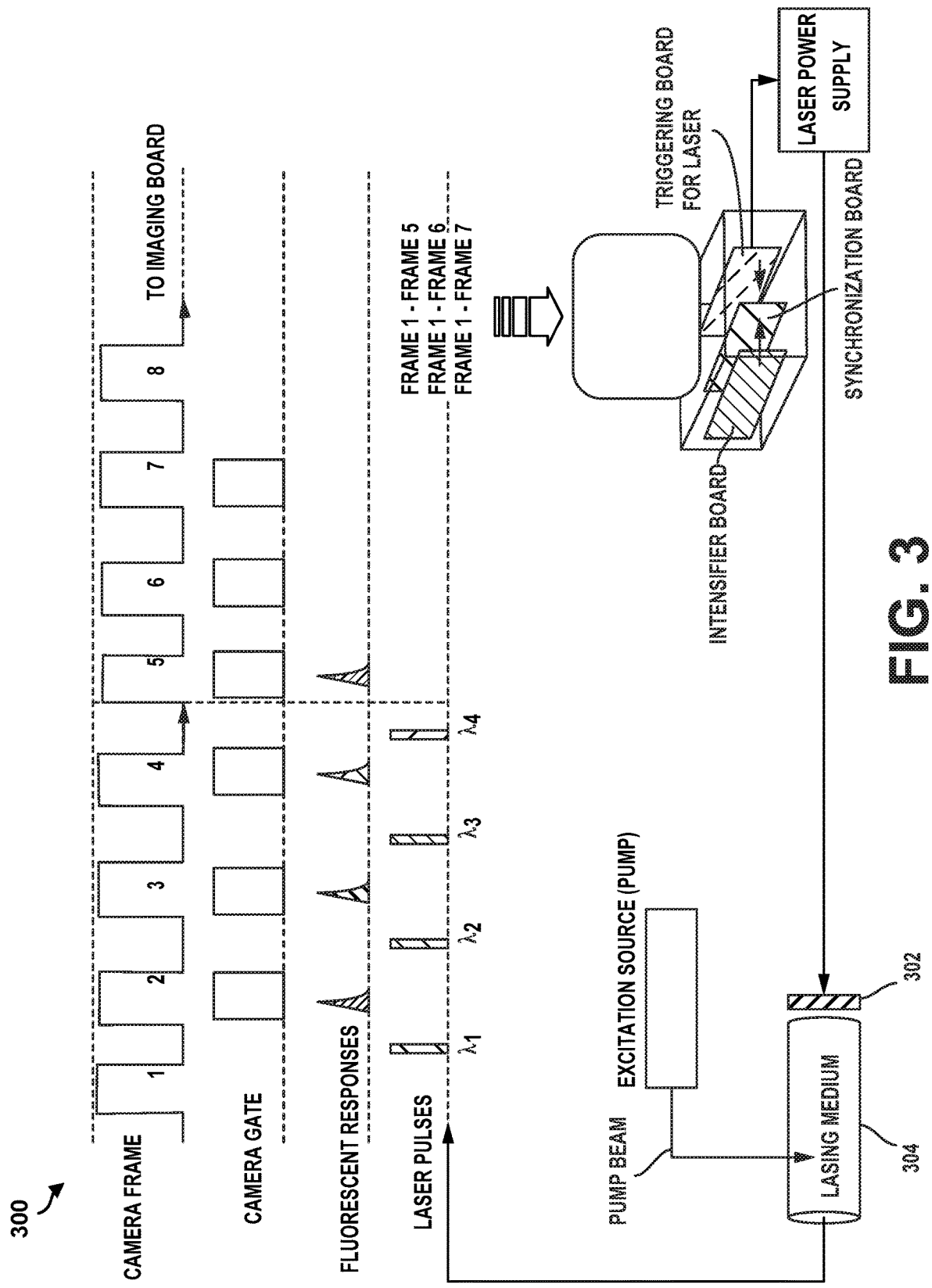
FIG. 3 is an example synchronization diagram, according to an example.

FIG. 3 is an example synchronization diagram 300, according to an example embodiment. Synchronization diagram 300 shows one possible manner of synchronizing operation of a laser, such as laser 106 of FIG. 1 or laser 206 of FIG. 2, with a gated camera, such as gated camera 110 of FIG. 1 or gated camera 210 of FIG. 2. In line with the discussion above, a transducer 302 could excite a pressure wave within a lasing medium 304 of a laser, and the laser could be shuttered, so that the laser provides four pulses of light having four different wavelengths. Shortly after each pulse impinges on a surface of a part, the surface could provide a fluorescent response. In order to capture the fluorescent responses, but ignore reflections from the laser pulses, an electronic gating system of the gated camera could be enabled (or opened) at a time that corresponds to when the fluorescent responses occur, but disabled (or closed) at other times when laser pulses are emitted. Further, the gated camera could capture frames of image data at a fixed rate.

As shown in FIG. 3, due to the operation of the electronic gating system, "camera frame 1" might not include any fluorescent response data since the camera gate is disabled. Other camera frames, however, could include fluorescent response data. In particular, "camera frame 2" could include a fluorescent response to a first pulse, "camera frame 3" could include a fluorescent response to a second pulse, "camera frame 4" could include a fluorescent response to a third pulse, and "camera frame 5" could include a fluorescent response to a fourth pulse.

In another example, a shutter of the laser could be controlled such that multiple pulses having the same wavelength of light are emitted in sequence. For instance, the shutter of the laser could be controlled so as to be open whenever light emitted by the laser has a particular wavelength, but closed when light emitted by the laser has a wavelength other than the particular wavelength. After capturing fluorescent response data for the multiple pulses, a processor can then perform time-averaging on the captured data, consistent with the number of laser pulses. For instance, if there were four pulses, the processor could combine the fluorescent response data from each of the four pulses, and divide the fluorescent response data by four. This time-averaging can help to increase the SNR of the fluorescent response data.

Figure 4:
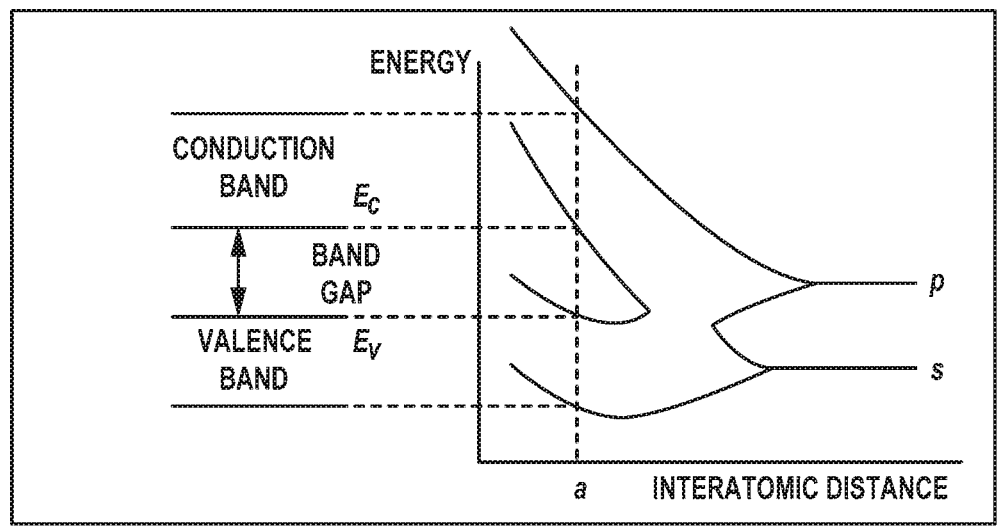
FIG. 4 is an example energy level diagram, according to an example.

FIG. 4 is an example energy level diagram 400. Energy level diagram 400 shows how the energy levels of a semiconductor, referred to as the conduction band and valence band, can change as a function of interatomic distance. The semiconductor may be a lasing medium of a laser, for example.

Semiconductors include energy levels referred to as a conduction band and a valence band. And, in a semiconductor laser, a photon is emitted when an electron drops from the conduction band to the valence band. As interatomic separation between atoms increases, the gap between the conduction band and the valence band decreases. Further, when the atoms are sufficiently separated such that the valence band is lower than the conduction band, the electrons can be localized to a single atom that is no longer part of the material.

As shown in FIG. 4, for an example semiconductor, at an interatomic distance a, there is a band gap between the conduction band and the valence band. When the semiconductor is stretched such that the interatomic distance increases to a distance that is greater than a, the band gap decreases. In other words, stretching a semiconductor lasing medium of a laser can cause the wavelength of light emitted by a semiconductor laser to increase. Conversely, when the semiconductor is compressed such that the interatomic distance decreases to a distance that is less than a, the band gap increases. Hence, compressing a semiconductor lasing medium of a laser can cause the wavelength of light emitted by a semiconductor laser to decrease.

Figure 5:
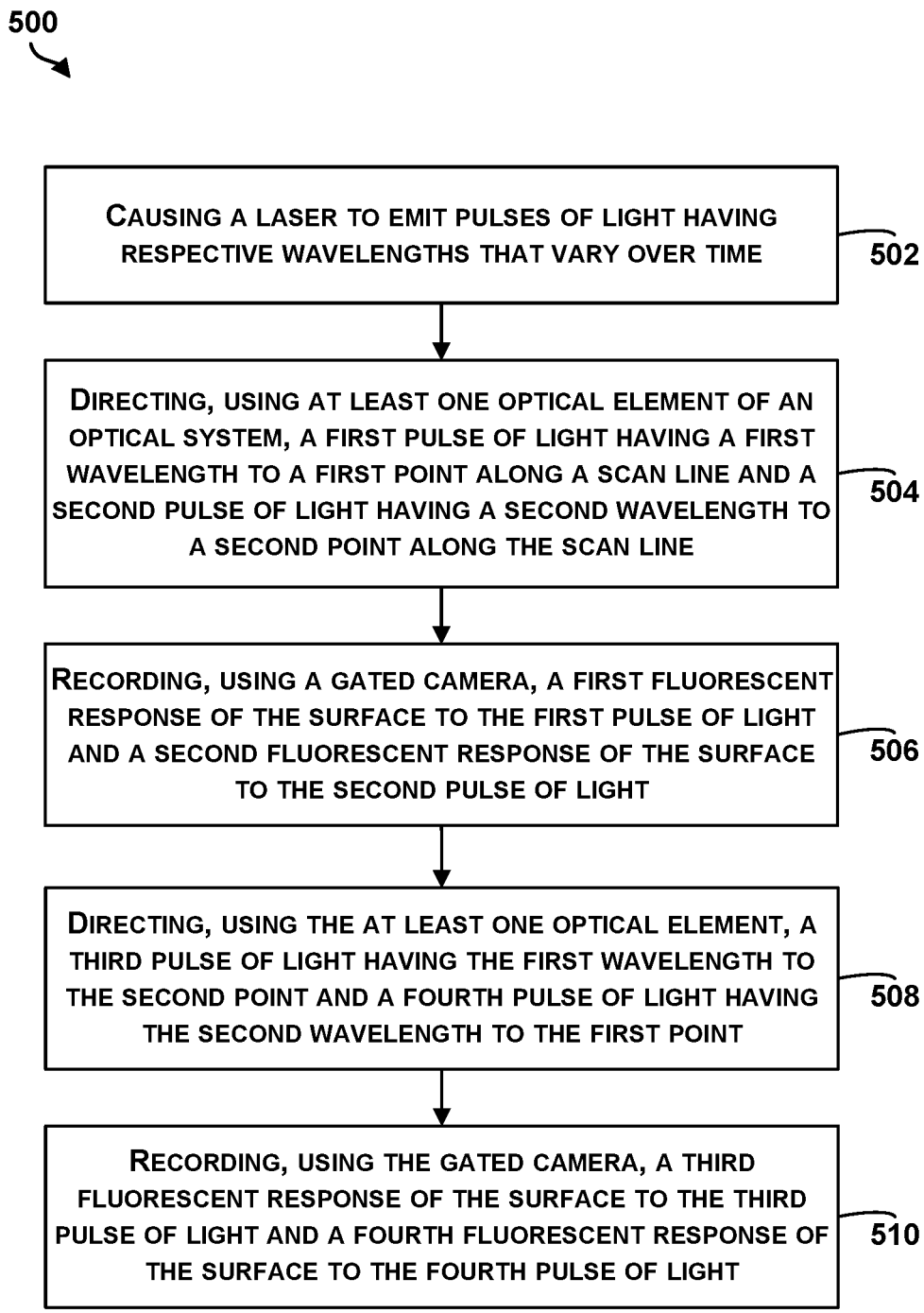
FIG. 5 shows a flowchart of an example method, according to an example.

FIG. 5 shows a flowchart of an example method. Method 500 shown in FIG. 5 presents an embodiment of a method that, for example, could be used with one of the systems shown in FIGS. 1 and 2, for example, or any of the systems disclosed herein. Any of the example devices or systems described herein, such as control system 112 of FIG. 1 or control system 112 of FIG. 2, may be used or configured to perform logical functions presented in FIG. 5.

Method 500 can include one or more operations, functions, or actions as illustrated by one or more of blocks 502-510. Although these blocks are illustrated in a sequential order, these blocks may also be performed in parallel, and/or in a different order than those described herein. Also, the various blocks may be combined into fewer blocks, divided into additional blocks, and/or removed based upon the desired implementation.

It should be understood that for this and other processes and methods disclosed herein, flowcharts show functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium or data storage, for example, such as a storage device including a disk or hard drive. The computer readable medium may include non-transitory computer readable medium or memory, for example, such as computer readable media that stores data for short periods of time like register memory, processor cache, and RAM. The computer readable media may also be any other volatile or non-volatile storage systems. The computer readable medium may be considered a tangible computer readable storage medium, for example.

Initially, at block 502, the method 500 includes causing a laser to emit pulses of light having respective wavelengths that vary over time. A control system could cause a transducer to excite a pressure wave down a length of a lasing medium of the laser, such that the pressure wave modifies energy levels of the lasing medium over time and alters the wavelength of the light emitted by the laser. In addition, the control system could control a shutter of the laser such that the shutter intermittingly blocks light emitted by the laser, yielding pulses of light.

At block 504, the method 500 includes directing, using at least one optical element of an optical system, a first pulse of light having a first wavelength to a first point along a scan line and a second pulse of light having a second wavelength to a second point along the scan line. The first pulse of light and the second pulse of light could pass through a prism of the optical system so that the first pulse of light and the second pulse of light are spread out in space. Alternatively, a scanning mirror of the optical system could separate the first pulse of light and the second pulse of light in space. For instance, a control system could control the scanning mirror so that the scanning mirror is in a first position when the first pulse of light impinges on the scanning mirror, and the scanning mirror is in a second position when the second pulse of light impinges on the scanning mirror.

At block 506, the method 500 includes recording, using a gated camera, a first fluorescent response of the surface to the first pulse of light and a second fluorescent response of the surface to the second pulse of light.

At block 508, the method 500 includes directing, using the at least one optical element, a third pulse of light having the first wavelength to the second point and a fourth pulse of light having the second wavelength to the first point. In line with the discussion above, a control system could control a scanning mirror so that the scanning mirror is in the second position when the third pulse impinges on the scanning mirror and the scanning mirror is in the first position when the fourth pulse impinges on the scanning mirror.

And at block 510, the method 500 includes recording, using the gated camera, a third fluorescent response of the surface to the third pulse of light and a fourth fluorescent response of the surface to the fourth pulse of light.

FIG. 6 shows an additional operation for use with the method shown in FIG. 6. Block 602 of FIG. 6 could be performed as part of block 506 of FIG. 5 and/or as part of block 510 of FIG. 5.

At block 602, FIG. 6 includes controlling an image intensifier of the gated camera such that an aperture of the gated camera is closed during exposure of the surface to the pulses of light emitted by the laser. By way of example, a control system could provide a command signal to an electronic gating system of the image intensifier that causes an electronic gate of the image intensifier to be disabled. The disabling of the electronic gate could coincide with times when a shutter of the laser is opened. On the other hand, the control system could provide a different command signal to the electronic gating system of the image intensifier that causes the electronic gate to be enabled at a short time (e.g., less than a nanosecond, one nanosecond, a few nanoseconds) after the shutter of the laser transitions from open to closed or at a short time after the shutter of the laser transitions from closed to open.

Figure 7:
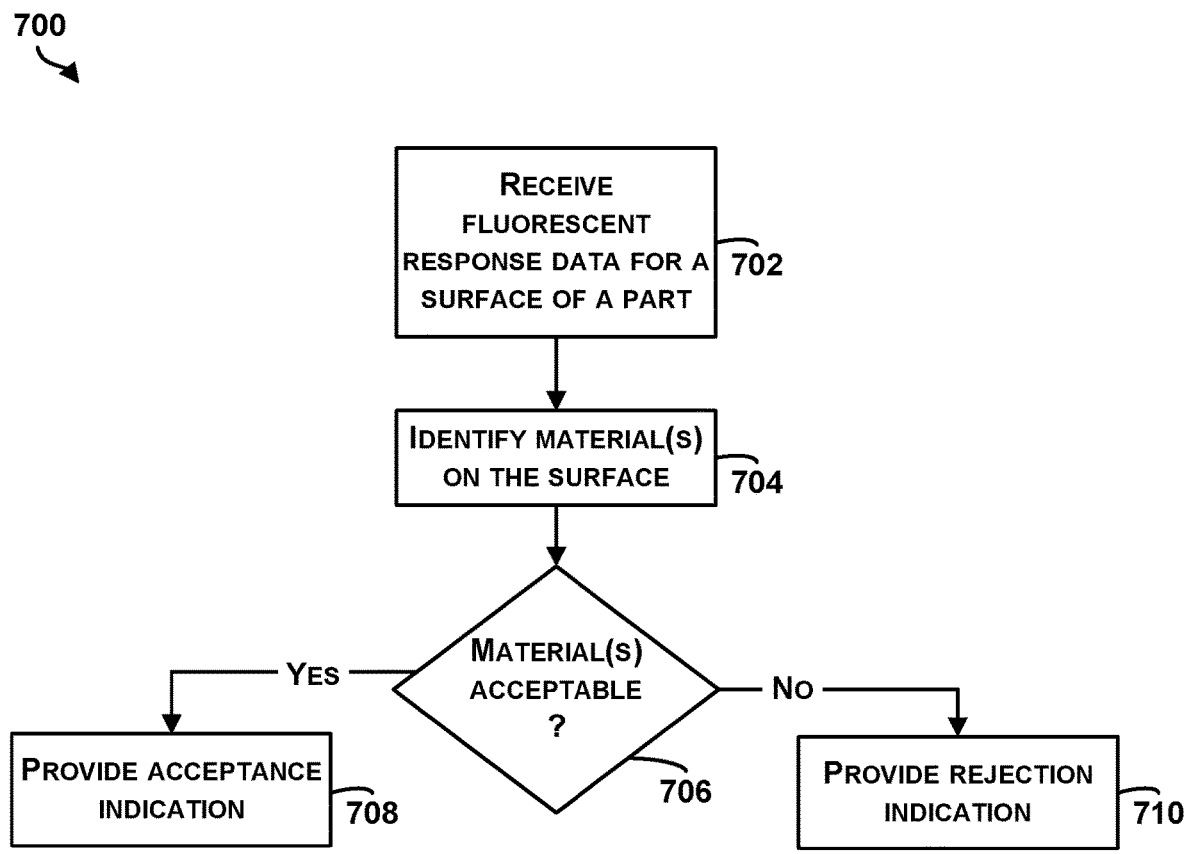
FIG. 7 shows a flowchart of another example method, according to an example.

FIG. 7 shows a flowchart of another example method. Method 700 shown in FIG. 7 presents an example of a method that, for example, could be used with one of the systems shown in FIGS. 1 and 2, for example, or any of the systems disclosed herein. Any of the example devices or systems described herein, such as control system 112 of FIG. 1 or control system 212 of FIG. 2, may be used or configured to perform logical functions presented in FIG. 7. Method 700 may include one or more operations, functions, or actions as illustrated by one or more of blocks 702-710. Although these blocks are illustrated in a sequential order, these blocks may also be performed in parallel, and/or in a different order than those described herein. Also, the various blocks may be combined into fewer blocks, divided into additional blocks, and/or removed based upon the desired implementation. Each block may represent a module, segment, or a portion of program code, which includes one or more instructions executable by a processor for implementing specific logical functions or steps in the process.

Method 700 could be combined with one or more blocks of method 500 of FIG. 5.

Initially, at block 702, the method 700 involves receiving fluorescent response data for a surface of a part. For instance, the fluorescent response data could be fluorescent responses of the surface at a point along a scan line, fluorescent responses of the surface at multiple points along a scan line, or fluorescent responses of the surface at points along multiple scan lines.

At block 704, the method 700 involves identifying material(s) on the surface of the part using the fluorescent response data. Identifying material(s) on the surface of the part may involve comparing the fluorescent response data to chemical signatures stored in a database of known chemical signatures.

At block 706, the method 700 involves determining whether or not the identified material(s) on the surface are acceptable. Determining whether or not the identified material(s) on the surface are acceptable may involve comparing the identified materials to a list of acceptable materials, or comparing the identified materials to a list of non-acceptable materials.

If the identified material(s) are acceptable, then, at block 708, an acceptance indication may be provided. For instance, a control system may cause an audio element (e.g., a speaker or a buzzer) to provide an audible acceptance indication and/or cause a lighting element (e.g., a light-emitting diode or a display) to provide a visual acceptance indication. Whereas, if the identified material(s) are not acceptable, then, at block 710, a rejection indication may be provided. Like the acceptance indication, the rejection indication may be an audible indication or a visual indication.

The providing of the acceptance indication may be optional. For instance, a control system may be configured to not provide any indication if the identified material(s) acceptable, but to provide a rejection indication if one or more of the identified materials are not-acceptable.

The description of the different advantageous arrangements has been presented for purposes of illustration and description, and is not intended to be exhaustive or limited to the examples in the form disclosed. After reviewing and understanding the foregoing disclosure, many modifications and variations will be apparent to those of ordinary skill in the art. Further, different examples may provide different advantages as compared to other examples. The example or examples selected are chosen and described in order to best explain the principles, the practical application, and to enable others of ordinary skill in the art to understand the disclosure for various examples with various modifications as are suited to the particular use contemplated.

What is claimed is:

1. A method for inspecting a surface, comprising:
   causing a laser to emit pulses of light having respective wavelengths that vary over time;
   directing, using at least one optical element of an optical system, a first pulse of light having a first wavelength to a first point along a scan line and a second pulse of light having a second wavelength to a second point along the scan line;
   recording, using a gated camera, a first fluorescent response of the surface to the first pulse of light and a second fluorescent response of the surface to the second pulse of light;
   directing, using the at least one optical element, a third pulse of light having the first wavelength to the second point and a fourth pulse of light having the second wavelength to the first point; and
   recording, using the gated camera, a third fluorescent response of the surface to the third pulse of light and a fourth fluorescent response of the surface to the fourth pulse of light.

2. The method of claim 1, further comprising controlling an image intensifier of the gated camera such that an aperture of the gated camera is closed during exposure of the surface to the pulses of light emitted by the laser.

3. The method of claim 2, wherein:
   the laser comprises a shutter, and
   causing the laser to emit pulses of light having respective wavelengths that vary over time comprises controlling the shutter such that the shutter intermittingly blocks light emitted by the laser, yielding pulses of light.

4. The method of claim 3, wherein controlling the shutter comprises controlling the shutter such that the shutter blocks light emitted by the laser when the aperture of the gated camera is open.

5. The method of claim 1, wherein causing the laser to emit pulses of light having respective wavelengths that vary over time comprises exciting a pressure wave down a length of a lasing medium of the laser such that the pressure wave modifies energy levels of the lasing medium over time and alters the wavelength of the light emitted by the laser.

6. The method of claim 1, wherein directing the first pulse of light to the first point along the scan line and the second pulse of light to the second point along the scan line comprises passing the first pulse of light and the second pulse of light through a prism.

7. The method of claim 1, wherein directing the first pulse of light to the first point along the scan line and the second pulse of light to the second point along the scan line comprises controlling a scanning mirror such that the scanning mirror is in a first position when the first pulse of light impinges on the scanning mirror and the scanning mirror is in a second position when the second pulse of light impinges on the scanning mirror.

8. The method of claim 7, wherein directing the third pulse of light to the second point along the scan line and the fourth pulse of light to the first point along the scan line comprises controlling a scanning mirror such that the scanning mirror is in the second position when the third pulse of light impinges on the scanning mirror and the scanning mirror is in the first position when the second pulse of light impinges on the scanning mirror.

9. The method of claim 1, further comprising identifying a material on the surface by analyzing the first fluorescent response and the fourth fluorescent response.

10. The method of claim 9, wherein identifying the material on the surface comprises comparing the first fluorescent response and the fourth fluorescent response to chemical signatures stored in a database of known chemical signatures.

11. The method of claim 9, further comprising:
determining that the identified material is an acceptable material; and
based on the determining, providing an acceptance indication.

12. The method of claim 9, further comprising:
determining that the identified material is not an acceptable material; and
based on the determining, providing a rejection indication.

13. A non-transitory computer-readable medium having stored therein instructions that are executable to cause a system to perform functions comprising:
causing a laser to emit pulses of light having respective wavelengths that vary over time;
directing, using at least one optical element of an optical system, a first pulse of light having a first wavelength to a first point along a scan line and a second pulse of light having a second wavelength to a second point along the scan line;
recording, using a gated camera, a first fluorescent response of a surface to the first pulse of light and a second fluorescent response of the surface to the second pulse of light;
directing, using the at least one optical element, a third pulse of light having the first wavelength to the second point and a fourth pulse of light having the second wavelength to the first point; and
recording, using the gated camera, a third fluorescent response of the surface to the third pulse of light and a fourth fluorescent response of the surface to the fourth pulse of light.

14. The non-transitory computer-readable medium of claim 13, wherein the functions further comprise controlling an image intensifier of the gated camera such that an aperture of the gated camera is closed during exposure of the surface to the pulses of light emitted by the laser.

15. The non-transitory computer-readable medium of claim 14, wherein:
the laser comprises a shutter, and
causing the laser to emit pulses of light having respective wavelengths that vary over time comprises controlling the shutter such that the shutter intermittingly blocks light emitted by the laser, yielding pulses of light.

16. The non-transitory computer-readable medium of claim 15, wherein controlling the shutter comprises controlling the shutter such that the shutter blocks light emitted by the laser when the aperture of the gated camera is open.

17. The non-transitory computer-readable medium of claim 13, wherein the functions further comprise identifying a material on the surface by analyzing the first fluorescent response and the fourth fluorescent response.

18. The non-transitory computer-readable medium of claim 17, wherein identifying the material on the surface comprises comparing the first fluorescent response and the fourth fluorescent response to chemical signatures stored in a database of known chemical signatures.

19. A method for inspecting a surface, comprising:
causing a laser to emit pulses of light having respective wavelengths that vary over time;
directing, using at least one optical element of an optical system, light emitted by the laser to points along a scan line during a plurality of time intervals such that:
the wavelength of the light directed to each point along the scan line varies from point to point within time intervals of the plurality of time intervals, and
over the plurality of time intervals, light having each wavelength of a plurality of wavelengths is directed to each point along the scan line; and
recording, using a gated camera, a fluorescent response of the surface from the light having each wavelength of the plurality of wavelengths at each point along the scan line.

20. The method of claim 19, further comprising identifying a material on the surface by analyzing fluorescent responses recorded by the gated camera.

* * * * *